Nov. 27, 1962 R. M. WOOD 3,066,249

JUNCTION TYPE SEMICONDUCTOR TRIODE

Filed April 7, 1953

INVENTOR
ROBERT M. WOOD
BY Paul S. Martin
ATTORNEY 3,066,249

JUNCTION TYPE SEMICONDUCTOR TRIODE

Robert M. Wood, Natick, Mass., assignor, by mesne assignments, to Sylvania Electric Products Inc., Wilmington, Del., a corporation of Delaware Filed Apr. 7, 1953, Ser. No. 347,218
15 Claims. (Cl. 317—235)

Figure 1:
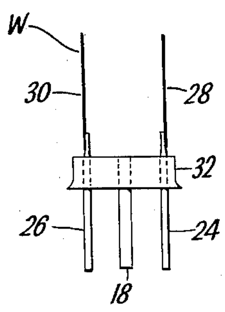
Figure 2:
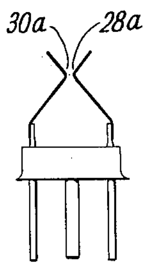
Figure 3:
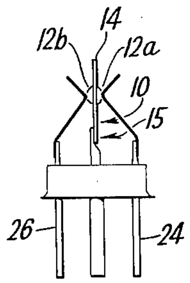

The present invention relates to so-called junction-type semiconductor triodes and the like, suitable for electrical amplification etc., and in particular to methods of fabrication of multiple-junction semiconductor devices.

The junction type of semiconductor triode includes a body of semiconductor material having two rectifying junctions separated by a relatively thin layer or slab of the semiconductor and having three terminals or ohmic contacts, one terminal to the intermediate layer of the semiconductor body, and one terminal to each rectifying junction. The fabrication of such devices has been relatively difficult, critical, and time-consuming, especially with respect to the provision of ohmic connections to the semiconductor layer and to the respective junctions.

Accordingly, it is an object of the present invention to provide a novel method of fabricating multiple-junction semiconductor devices. Specifically, it is within the contemplation of the present invention to provide a reliable method for producing ohmic connections to the rectifying junctions of semiconductor triodes.

A typical practice previously followed in manufacturing semiconductor triodes consisted in the alloying of small areas or "spots" of or containing donor or acceptor-type materials to a thin slab or wafer of semiconductor material of opposite conductivity type to obtain a multiple rectifying junction unit. For a detailed description of method and apparatus for providing the unit of the aforesaid type, reference may be made to co-pending application Serial No. 304,291, filed August 14, 1952, and assigned to the assignee of the present invention. In making such devices it has been difficult to make the connections required, especially when considering the initial small size and extreme thinness of the units and the still smaller area usually occupied by the "spot" junctions.

Therefore, it is among the objects of the present invention to provide a novel physical construction for junction-type semiconductor devices facilitating initial adjustment and arrangement of the components thereof, and the provision of appropriate non-rectifying connections. In the illustrative method of achieving objects of the present invention to arrive at the improved physical construction detailed below, a semiconductor body is initially provided, having opposed junction-forming alloyed areas on opposite sides of a thin slab of semiconductor material, and this body with the rectifying junctions is mounted between a pair of resilient terminal members. These are arranged in opposing relation to each other with an initial separation less than the distance between opposite extremities of the alloyed areas. By disposing the semiconductor body between the terminal members, the latter due to their resilience and initial position are biased apart to provide suitable bearing contact against the interposed junction-forming areas. As a further feature, the alloyed areas are heat-softened for a period of time sufficient to allow the spring terminal members to become embedded in the alloyed areas thereby providing excellent ohmic contacts with the respective alloy dots.

As a still further feature of the invention, the respective terminal members serve as heater wires through which a heating current may be passed for rendering the junction-forming areas molten. However, in lieu of this method of localized heating, it is possible to use any suitable external source of heat such as an oven effective to render the junctions molten for the required period, without physical pressure that would be incidental to soldering such heater-to-unit connections.

Figure 4:
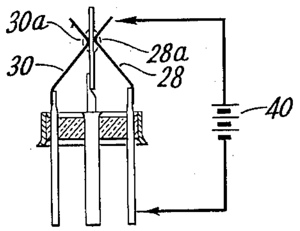
Figure 5:
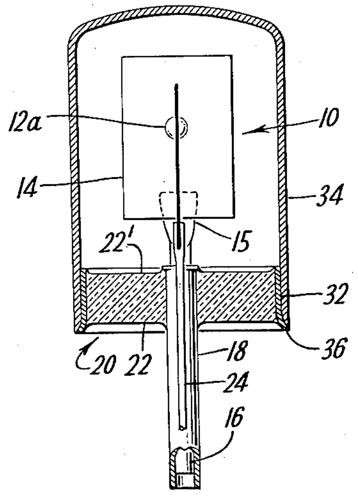

The nature of the invention and its further features of novelty will be best appreciated from the following illustrative disclosure thereof, shown in the accompanying drawings. In these drawings:

FIGS. 1 to 4 are flow diagrams illustrating various stages during processing of semiconductor junction-type triodes in accordance with features of the present invention; and FIG. 5 is a greatly enlarged elevation of a finished semiconductor junction-type triode constructed by the method of FIGS. 1 to 4 and embodying features of the invention.

In FIG. 5 there is shown a junction type semiconductor triode in which a semiconductor body 10 is formed, for example, of germanium desirably having a resistivity in excess of 5 ohm-centimeters. As described in the aforementioned co-pending application, the germanium crystal body 10 may be formed with spot junctions 12*a*, 12*b* separated by a thin layer or slab of the semiconductive material, designated by the numeral 14. For the present purposes, it will suffice to point out that the rectifying junctions 12*a*, 12*b* are formed on the germanium slab 14 by applying limited volumes of a suitable molten metal or alloy to accurately delimited and aligned areas on opposite semiconductor surfaces, advantageously for a limited time so that at the treatment temperature, the applied metal becomes saturated with germanium. These junctions or terminals are of any desired relative size, one of them (the input electrode) preferably being smaller, as detailed in the aforementioned application. As seen in the drawings, the junctions 12*a*, 12*b* are accurately centered opposite each other to assure effective performance of the units produced. It should be understood that the germanium slice 14 may predominantly contain a donor or acceptor impurity and the metal of the junctions is then appropriately doped with an acceptor or donor to provide the required rectifying transitions or junctions between the applied materials and the semiconductor slice 14. As an example, indium dots are alloyed to the opposite surfaces of a thin slice of N-type germanium.

The semiconductor unit 10 with the "spot" junctions 12*a*, 12*b* is suitably mounted on a lead 16 as by soldering at 15. The lead then being telescoped within a complementary conductive guide member 18 arranged axially of an insulating base or button 20. The base 20 may be of the glass type commonly employed in the assembly of radio tubes, the centrally disposed guide member 18 being arranged to project from opposite faces 22, 22' of the base 20.

Molded integral with the base 20 is a further pair of spaced leads 24, 26 arranged parallel to and aligned on opposite sides of the guide member or sleeve 18. The leads 24, 26 include ends projecting from the under or lower face 22 of the base, which along with the adjacent end of the guide sleeve 18 may be made in the form of prongs or pins to serve as plug-ins or wire terminals for connecting the completed semiconductor triode to appropriate external circuits. The ends of the leads 24, 26 projecting from the face 22' of the base 20 terminate short of the adjacent end of the semiconductor body 10 and carry terminal members 28, 30 fixed thereto by welding, soldering or the like. The terminal members 28, 30 are arranged in a common plane normal to the plane of the slab 14 of the semiconductor body 10. The terminal members 28, 30 are in the form of a relatively thin spring-like wire or whisker of tungsten or the like. They may include intermediate contact parts 28*a*, 30*a* of substantially V-shaped configuration, where heating as in FIG. 4 is to be effected. The contact or bearing parts, 28*a*, 30*a* are arranged in opposing relation and are embedded within the alloy terminals 12*a*, 12*b*. The joint 15 between the semiconductor slab 14 and the lead 16, formed as by soldering, serves as a first ohmic contact for the triode while the embedded contact parts 28*a*, 30*a* serve as second and third ohmic contacts to the alloy terminals 12*a*, 12*b* of the triode.

A suitable hermetic enclosure is provided for the electrically completed semiconductor triode by a rim or annular flange 32 integrally molded with the base or button 22 and a downwardly opening cover 34 force fitted over the rim 32 and secured thereto in any appropriate manner, as for example by seam welding or soldering the rim 32 and the cover 34 together along the lower coextensive edge 36.

In making semiconductor devices, such as the illustrative transistor of FIG. 5, the base 22 is integrally molded with the central guide member 18 and the leads 24, 26. Thereafter straight lengths of resilient wire of tungsten or the like are welded to the upper ends of the leads 24, 26, to complete the sub-assembly of FIG. 1. By appropriate forming dies or tools, the resilient or spring-like terminal parts 28, 30 are formed, advantageously with the intermediate bearing or contact parts 28*a*, 30*a* in opposed spaced and coplanar relation. During the forming operation or subsequent thereto, the separation between the contact or terminal parts 28*a*, 30*a* is established to be somewhat smaller than the distance between the opposite extremities or contact surfaces of the junctions 12*a*, 12*b*. The term "separation" is used broadly for in establishing the desired spring bias, contact parts 28*a*, 30*a* may actually cross the axis of tube 18, and pass each other.

Thereupon, the electrically completed semiconductor unit 10 with the alloyed junction forming areas 12*a*, 12*b* on opposite sides of the semiconductor slab 14 are connected to a suitable lead 16 by the soldered joint 15, the latter serving as an ohmic connection to the semiconductor slab 14. The lead 16 is inserted within the sleeve 18 and the semiconductor slab 14 moves along the plane of adjustment normal to the plane of the terminal members 28, 30 until the junctions 12*a*, 12*b* are interposed between the springy contact parts 28*a*, 30*a*, the junctions serving to bias the contact parts. These bearing contacts provide a relatively stiff, electrically completed subassembly when the lead 16 is secured to the sleeve 18 by welding or otherwise suitably deforming the sleeve 18.

Thereafter, the alloy areas 12*a*, 12*b* are heated to melt the alloy and permit the whiskers or terminal members now biased, to embed themselves into the alloy terminals. Preferably localized heating of the junction areas is used, brought about by passing a heating current from a suitable battery 40 or the like through each of the respective terminal wires 28 and 30, the terminals providing resistance sufficient to cause heating in the region of the associated alloy terminal to obtain the desired permanent connection between the respective contact parts 28*a*, 30*a* and the junctions 12*a*, 12*b*.

Subsequent to the embedding and fixing of the contact parts 28*a*, 30*a* of the terminal parts 28, 30 in the associated junctions 12*a*, 12*b*, the unit is desirably hermetically sealed by placing the cover 34 about the mounted semiconductor unit 10, as seen in FIG. 5, and welding or otherwise fixing the cover to the rim 32.

The foregoing is susceptible to a latitude of variations. Various details and adaptations will occur to those skilled in the art, and accordingly the appended claims should be allowed a latitude of interpretation consistent with the spirit and scope of the invention.

What is claimed is:

1. A semiconductor triode comprising a multiple junction wafer-like semiconductor body having alloy terminals establishing rectifying junctions on opposite sides of a separating semiconductor layer, a flat base support disposed approximately perpendicular to the plane of the wafer, means on said support including opposed bearing contacts biased apart by said body and said alloy terminals, a portion of each contact being embedded in a respective alloy terminal and providing ohmic connection to the respective alloy terminal, and a further ohmic connection to said separating semiconductor layer outside of the region of said alloy terminals, the wafer being supported by said ohmic connecting means.

2. In a multiple junction semiconductor device including a semiconductor body having rectifying terminal areas raised in relief on opposite sides of a separating semiconductor layer, a flat support disposed approximately at right angles to the plane of said layer, a pair of leads secured to said support and spaced apart a distance greater than the outer contour of the terminal areas, terminal members on said leads having opposed spring-like contact portion extending toward the semiconductor body and forming a flared opening, said spring-like contact portions being adapted to bear against the respective rectifying terminal areas, and means on said support mounting said semiconductor body between said terminal members with said contact parts bearing against the respective rectifying areas and providing ohmic connections thereto.

3. The method of forming terminals for a multiple-junction semiconductor device comprising the step of mounting a semiconductor body having rectifying junctions formed by alloy terminals on opposite sides of a separating semiconductor layer between fixed spring-like connecting members which clear the body but are in bearing contact with the respective terminals, and heating said terminals for a period sufficient to allow said connecting members to become embedded within the respective terminals.

4. The method of forming terminals for a multiple-junction semiconductor device comprising the step of mounting a semiconductor body having projecting alloy terminals forming rectifying junctions on opposite sides of a separating semiconductor layer between fixed spring-like terminal members having an initial separation less than the distance between the junction surfaces in bearing contact with the respective rectifying junctions, melting said terminals by the local application of heat to cause said terminal members to become embedded within the respective rectifying junctions, and forming a further connection to said separating semiconductor layer outside of said respective rectifying junctions.

5. The method of forming a semiconductor triode of the type including a semiconductor body having opposed junction-forming alloyed areas comprising the steps of fixing a pair of resilient terminal members in opposing relation with an initial separation less than the distance between opposite extremities of said alloyed areas, interposing said semiconductor body between said terminal members with said alloyed areas in contact with said terminal members and biasing same apart, and rendering said alloyed areas molten for a sufficient period of time to allow said terminal members to embed themselves in said alloyed areas to provide ohmic contacts with the respective alloyed areas.

6. The method of forming a semiconductor triode of the type including a semiconductor body having opposed junction-forming areas separated by a semiconductor slab comprising the steps of fixing a pair of spring-like terminal wires in coplanar relation normal to an adjustment plane, initially separating contact parts of said terminal wires less than the separation between the outermost ends of said junction-forming areas, displacing said body along said adjustment plane into a predetermined position wherein said contact parts are biased apart and in bearing engagement with said junction-forming areas, fixing said body in said predetermined position, and passing current through the respective terminal wires, each serving as a heater wire for a period sufficient to render said junction-forming areas molten to allow the contact parts of said terminal members to become embedded in said junction-forming areas to provide respective ohmic connections.

7. The method of forming a semiconductor triode of the type including a semiconductor body having opposed junction-forming areas separated by a semiconductor slab comprising the steps of fixing a pair of spring-like terminal members in coplanar relation normal to an adjustment plane, initially setting contact parts of said terminal members in positions less than the separation between the outermost ends of said junction-forming areas, displacing said body along said adjustment plane into a predetermined position wherein said contact parts are biased apart and in bearing engagement with said junction-forming areas, fixing said body in said predetermined position, passing current through the respective terminal members which at such time serve as heater wires, for a period sufficient to render said junction-forming areas molten to allow the contact parts of said terminal members to become embedded in said junction-forming areas to provide respective ohmic connections, and providing a further ohmic connection to said slab outside of the region of said junction-forming areas.

8. The method of forming a semiconductor triode of the type including a semiconductor body having opposed raised junction-forming alloyed areas, comprising the steps of fixing to a support a pair of resilient terminal members having portions in opposing relation with an initial separation less than the distance between opposite extremities of said alloyed areas but greater than the body thickness, interposing said semiconductor body between said terminal members with the latter in said resilient contact with the alloyed areas, and rendering said alloyed areas molten for a sufficient period of time to allow said terminal members to embed themselves in said alloyed areas to provide ohmic contacts therewith.

9. The method of forming a semiconductor triode of the type including a semiconductor body having opposed junction-forming alloyed areas, comprising the steps of fixing a pair of resilient terminal members having reentrant portions in opposing relation spaced less than the distance between the alloyed area surfaces, interposing said semiconductor body between said reentrant portions of the terminal members with said alloyed areas resiliently engaged by said portions, and rendering said alloyed areas molten for a sufficient period of time to allow said terminal members to embed themselves to said alloyed areas to provide ohmic contacts.

10. A semiconductor device comprising a body of semiconductor material having a contacting portion extending from a surface thereof, an electrically conductive spring member having a projection thereon, said spring member being mounted in such a position with respect to said body that said projection makes slidable contact with said contacting portion, means for making electrical connections to said body and means for making separate contact to said spring member.

11. A semiconductor device comprising a base member, an electrically conductive spring member mounted on said base member and having a projection thereon, a wafer of semiconductor material having a contact projecting from a surface thereof, said wafer being attached to said base member in such a position that said projection makes slidable contact with said projecting contact, means for making electrical connections to said wafer of semiconductive material and means for making separate contact to said spring member.

12. A semiconductor device comprising a base member, a pair of electrically conductive spring members mounted on said base member and each having a projection thereon, a body of semiconductor material having a pair of projecting contacts thereon and supported on said base member in a position such that each of said projections on said spring members makes contact with respective ones of said contacts, means for making electrical connections to said spring members and said body.

13. A semiconductor device comprising a base member, a pair of electrically conductive spring members mounted on said base member and each having a projection extended toward the other, a body of semiconductor material having the projecting emitter contact of one face of said body and a projecting collector contact on the opposite face of said body, said body being supported on said base member in a position such that said projections on said spring members contact said emitter and collector contacts, means for making electrical contact to said members and said wafer.

14. A semiconductor device comprising a base member, a pair of electrically conductive spring members mounted on said base member and each having a projection extended toward the other, a wafer of semiconductor material having an emitter dot extending from one face of said body and a collector dot extending from the opposite face of said wafer, said wafer being supported on said base member in a position such that each said projection on said spring members contacts respective dots, means for making electrical connections to said members and said wafer.

15. A semiconductor device comprising a base member, an electrically conductive resilient member mounted on said base member and having a projection thereon, a body of semiconductor material having a contact projecting from a surface thereof attached to said base member in such a position that said projection makes slidable contact with said projecting contact, means for making electrical connection to said wafer of semiconductor material and means for making separate contact to said resilient member.

References Cited in the file of this patent

UNITED STATES PATENTS

| | | |
|---|---|---|
| 1,898,321 | Strobel | Feb. 21, 1933 |
| 2,560,579 | Kock et al. | July 17, 1951 |
| 2,584,461 | James et al. | Feb. 5, 1952 |
| 2,595,475 | McLaughlin | May 6, 1952 |
| 2,644,852 | Dunlap | July 7, 1953 |
| 2,644,914 | Kircher | July 7, 1953 |
| 2,646,536 | Benzer et al. | July 21, 1953 |
| 2,664,528 | Stelmak | Dec. 29, 1953 |
| 2,701,326 | Pfann et al. | Feb. 1, 1955 |
| 2,731,704 | Spanos | Jan. 24, 1956 |
| 2,742,383 | Barnes et al. | Apr. 17, 1956 |
| 2,792,538 | Pfann | May 14, 1957 |

FOREIGN PATENTS

| | | |
|---|---|---|
| 127,170 | Australia | Mar. 17, 1948 |